United States Patent
Dai

(10) Patent No.: US 8,294,832 B2
(45) Date of Patent: Oct. 23, 2012

(54) REMOTE CONTROL AND TELEVISION AND POWER INDICATION SYSTEM

(75) Inventor: Lung Dai, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 356 days.

(21) Appl. No.: 12/710,369

(22) Filed: Feb. 23, 2010

(65) Prior Publication Data
US 2010/0315562 A1 Dec. 16, 2010

(30) Foreign Application Priority Data
Jun. 11, 2009 (CN) .......................... 2009 1 0303173

(51) Int. Cl.
*H04N 5/44* (2011.01)
*G08C 19/12* (2006.01)
*G08B 21/00* (2006.01)
(52) U.S. Cl. .................. 348/734; 340/636.15; 340/13.31
(58) Field of Classification Search .................. 348/734; 340/13.31, 663, 636.1–636.21
See application file for complete search history.

(56) References Cited

U.S. PATENT DOCUMENTS
5,583,491 A * 12/1996 Kim .......................... 340/13.31
6,529,556 B1 3/2003 Perdue et al.
2009/0262254 A1* 10/2009 Reams .......................... 348/734

FOREIGN PATENT DOCUMENTS
CN 2352866 Y 12/1999
CN 1246193 A 3/2000
* cited by examiner Primary Examiner — Michael Lee
(74) Attorney, Agent, or Firm — Altis Law Group, Inc.

(57) ABSTRACT

A remote control for an electronic device includes a plurality of keys, a power supply, a power control unit, a code modulating unit, and a transmitter. The plurality of keys generates different first electrical signals when actuated. The power supply is operable to power the remote control. The power control unit detects a voltage of the power supply, and generates a second electrical signal when the voltage of the power supply falls below a predetermined value. The code modulating unit generates different key code signals according to the different first electrical signals, and a switch code signal according to the second electrical signal. The transmitter converts the different key code signals and the switch code signal into different wireless signals, and transmits the different wireless signals to the electronic device.

16 Claims, 5 Drawing Sheets

REMOTE CONTROL AND TELEVISION AND POWER INDICATION SYSTEM

BACKGROUND

1. Technical Field

The present disclosure relates to televisions (TVs), and more particularly to a remote control used with a television.

2. Description of Related Art

Generally, remote controls of televisions (TVs) are powered independently by batteries. As the batteries or battery of the remote control goes down, signals from the remote control gets weaker and the user may have to position the remote control closer to the TV in order for the remote control signal to reach the TV to change a channel or performing other functions on the TV. However, when the user is unaware that the batteries are low, the user may repeatedly press the buttons on the remote control before the appropriate function is realized. This is an inconvenience.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiments of a remote control of a television which has a power indication system. Moreover, in the drawings, like reference numerals designate corresponding parts throughout several views.

DETAILED DESCRIPTION

Figure 1:
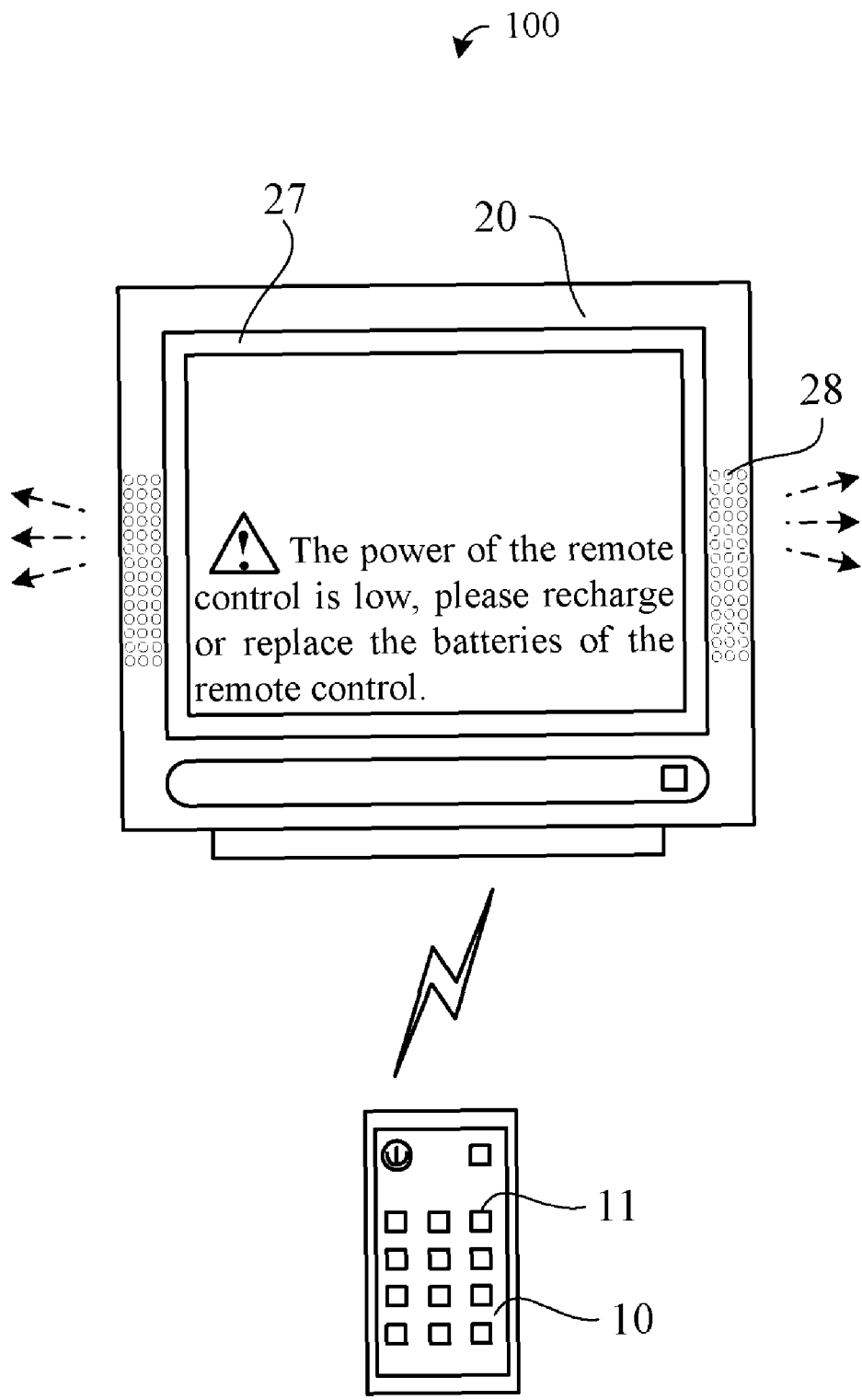
FIG. 1 is a schematic view of a power indication system in accordance with an exemplary embodiment, including a remote control and a television.

Referring to FIG. 1, a power indication system 100 in accordance with one embodiment is illustrated. The power indication system 100 includes a remote control 10 and an electronic device 20. In this embodiment, the electronic device 20 is a television (TV).

Figure 2:
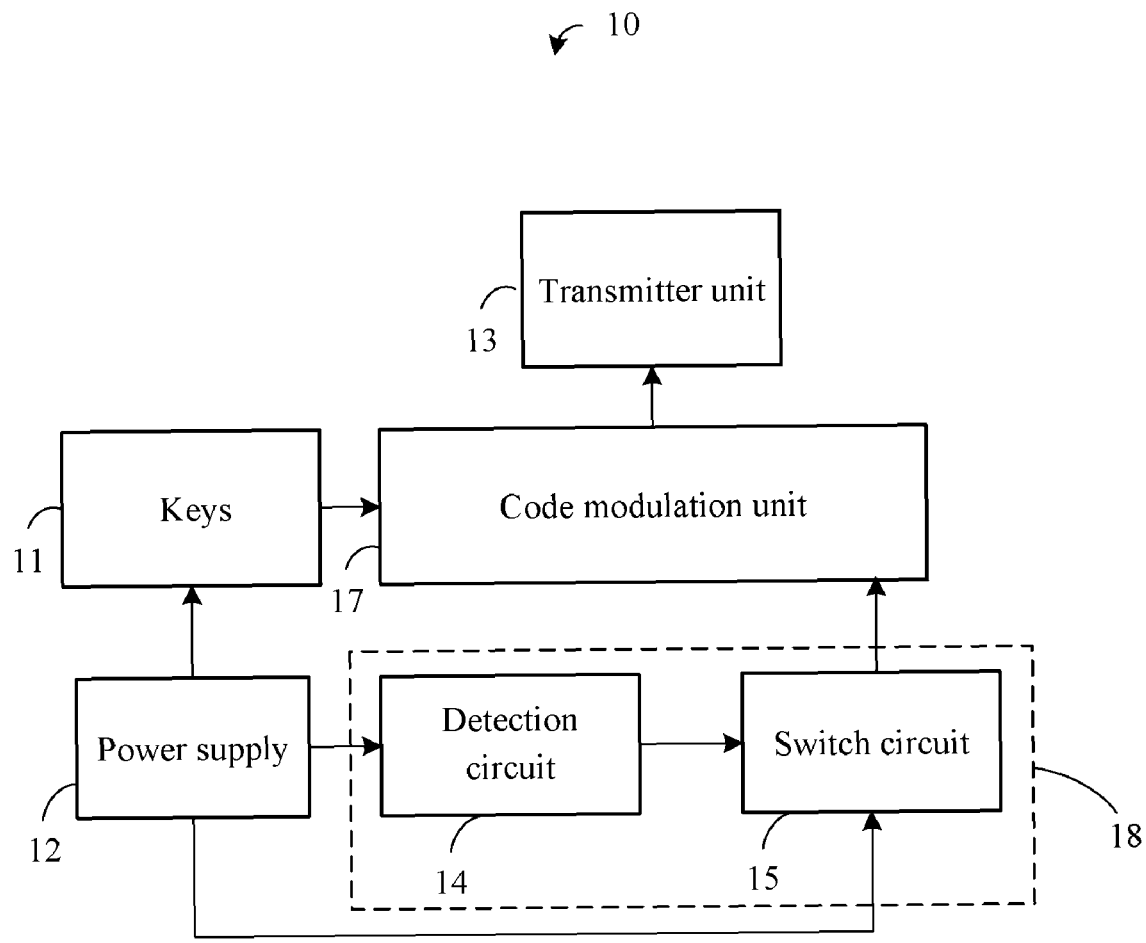
FIG. 2 is a block diagram of the remote control of FIG. 1.

Referring to FIG. 2, the remote control 10 is configured for controlling the electronic device 20. The remote control 10 includes a plurality of keys 11, a power supply 12, a transmitter unit 13, a code modulating unit 17, and a power control unit 18.

The power supply 12 is operable to power the remote control 10. In this embodiment, the power supply 12 includes two dry cell batteries. The plurality of keys 11 is configured for generating different first electrical signals when they are actuated.

The power control unit 18 is configured for detecting a voltage of the power supply 12, and generating a second electrical signal when the power supply 12 falls below a predetermined value. In this embodiment, the predetermined value is an operating voltage of the remote control 10, below which the power supply 12 can be considered to be in a low power state.

The power control unit 18 includes a detection circuit 14 and a switch circuit 15. The detection circuit 14 is configured for detecting the voltage of the power supply 12, and generating a first detection signal when the power supply 12 falls below the predetermined value. The detection circuit 14 is further configured for generating a second detection signal when the power supply 12 is no lower than the predetermined value.

Figure 3:
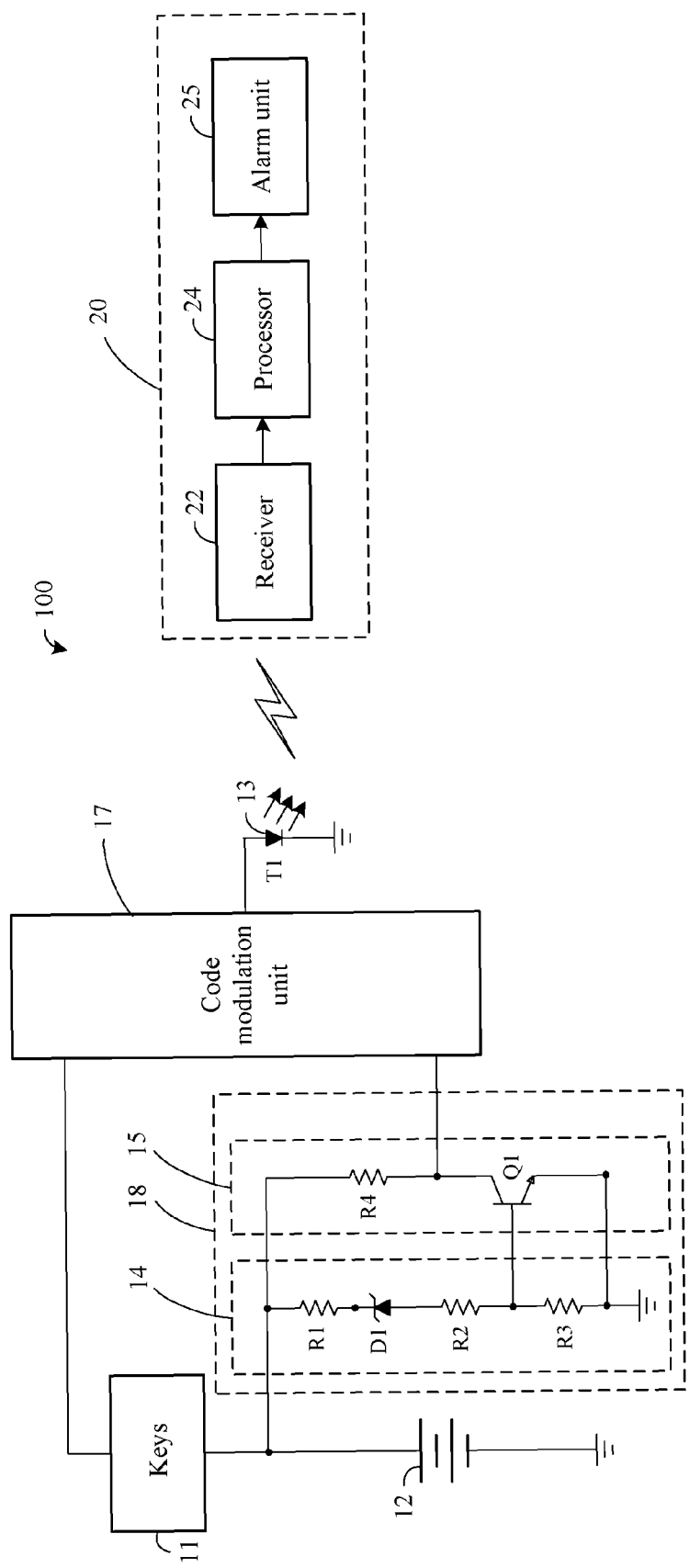
FIG. 3 is a block diagram of the television of FIG. 1.

Referring to FIG. 3, in this embodiment, the detection circuit 14 includes a first resistor R1, a second resistor R2, a third resistor R3, and a Zener diode D1. The cathode of the Zener diode D1 is electrically connected to the positive terminal of the power supply 12 via the first resistor R1. The anode of the Zener diode D1 is connected to one terminal of the second resistor R2 and the other terminal of the second resistor R2 is connected to one terminal of the third resistor R3, the other terminal of the third resistor R3 is grounded. When the power supply 12 is below the Zener voltage, the Zener diode D1 enters a high resistor (off) state. The detection circuit 14 generates the first detection signal (low level) at a connection node between the second resistor R2 and the third resistor R3. When the power supply 12 is above the Zener voltage, the Zener diode D1 conducts (open state). In this state, the detection circuit 14 generates and outputs a second detection signal (high level) at the connection node between the second resistor R2 and the third resistor R3.

In other embodiments, the detection circuit 14 may include a comparator configured for comparing the voltage of the power supply 12 to the operating voltage of the remote control 10, generating the first detection signal when the power supply 12 falls below the operating voltage, and generating the second detection signal when the power supply 12 exceeds the operating voltage.

The switch circuit 15 is configured for enabling an electrical connection between the power supply 12 and the code modulating unit 17 according to the first detection signal, and generating the second electrical signal accordingly. The switch circuit 15 is further configured for disabling the electrical connection between the power supply 12 and the code modulating unit 17 according to the second detection signal.

In this embodiment, the switch circuit 15 includes a fourth resistor R4 and a transistor Q1. The transistor Q1 is a NPN type bipolar junction transistor. The collector of the transistor Q1 is electrically connected to the positive terminal of the power supply 12 via the fourth resistor R4. The base of the transistor Q1 is electrically connected to the connection node between the second resistor R2 and the third resistor R3. The emitter of the transistor Q1 is electrically grounded. When the base of the transistor Q1 receives the first detection signal from the detection circuit 14, the transistor Q1 is turned off. Output of the power supply 12 is transmitted to the code modulating unit 17 via the resistor R4. In other words, the switch circuit 15 enables the electrical connection between the power supply 12 and the code modulating unit 17, and the switch circuit 15 generates and transmits the second electrical signal to the code modulating unit 17. When the base of the transistor Q1 receives the second detection signal from the detection circuit 14, the transistor Q1 is turned on and the code modulating unit 17 is electrically grounded via the transistor Q1. In other words, the switch circuit 15 disables the electrical connection between the power supply 12 and the code modulating unit 17.

The code modulating unit 17 is configured for generating different key code signals (different first code signals) according to the different first electrical signals, and generating a switch code signal (second code signal) according to the second electrical signal. For example, when one key 11 is pressed, the key 11 generates a first electrical signal accordingly, and the code modulating unit 17 generates one key code signal according to the first electrical signal. For another example, when the power supply 12 falls below the operating voltage of the remote control 10 (in the lower-power mode), the detection circuit 14 generates the first detection signal, and the switch circuit 15 generates the second electrical signal according to the first detection signal. The code modulating unit 17 generates the switch code signal according to the second electrical signal. The code modulating unit 17, used for a keyboard, is well known and will not be described.

The transmitter unit 13 is configured for converting different key code and the switch code signals into wireless signals, and sending the wireless signals to the electronic device 20. In this embodiment, the transmitter unit 13 generates different key wireless signals (different first wireless signals) according to the different key code signals, and generating a switch wireless signal (second wireless signal) according to the switch code signal. In this embodiment, the transmitter unit 13 includes an infrared emitting diode T1. When the infrared emitting diode T1 is enabled, it emits infrared light. The anode of the infrared emitting diode T1 is electrically connected to the code modulating unit 17 to receive the different key code signals and the switch code signal. The cathode of the infrared emitting diode T1 is electrically grounded. Different frequencies for the infrared emitting diode T1 acting in one microsecond represent different code signals. In other embodiments, the transmitter unit 13 and code modulating unit 17 can be replaced by a transceiver.

Figure 4:
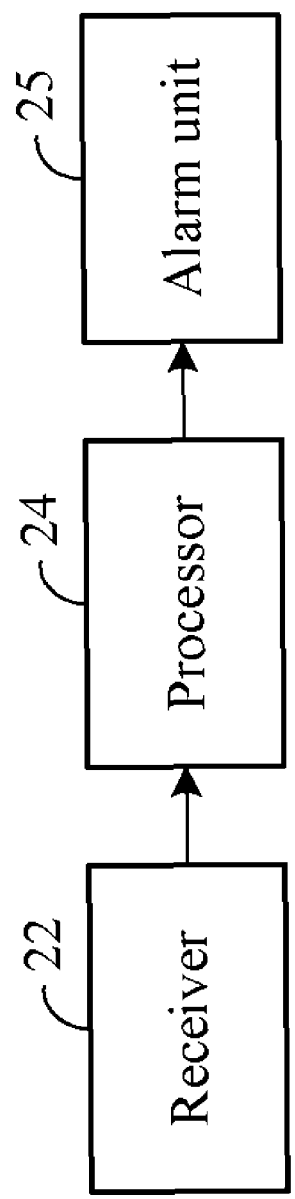
FIG. 4 is a partial circuit of the power indication system of FIG. 1.

Referring to FIGS. 3 and 4, the electronic device 20 is controlled by the remote control 10. The electronic device 20 is configured for receiving the switch wireless signal, and outputting an audio or video alert according to the switch wireless signal. The electronic device 20 is further configured for adjusting itself according to the different key wireless signals. The electronic device 20 includes a receiver 22, a processor 24, and an alarm unit 25.

The receiver 22 is configured for receiving different key wireless signal and switch wireless signals, and generating different key driving signals (different first driving signals) according to the corresponding different key wireless signals, and generating a switch driving signal (second driving signal) according to the switch wireless signal. In this embodiment, the receiver 22 includes an infrared receiving diode for receiving the infrared light from the transmitter unit 13, and a decode modulating unit for decoding the output from the infrared receiving diode. In other embodiments, the receiver 22 can be a transceiver.

The processor 24 is configured for receiving the different key driving signals and adjusting the electronic device 20 accordingly thereto. For example, adjustment of the electronic device 20 can comprise switching channels, adjusting volume and tone, and others. The processor 24 is further configured for receiving the switch driving signal, and generating an alert signal accordingly.

The alarm unit 25 is configured for outputting the audio or video alert according to the alert signal. In this embodiment, the alarm unit 25 includes a display 27 for displaying the video alert, and two speakers 28 for outputting the audio alert (as shown in FIG. 1). In other embodiments, the number of speakers may be one or more than two. For example, the audio or video alert may be a message stating "The power of the remote control is low, please recharge or replace the batteries of the remote control".

As discussed, the power indication system 100 can promptly provide notification when the power of the remote control 10 falls below the operating voltage thereof. Any operational problems occurring can thus be easily identified.

Figure 5:
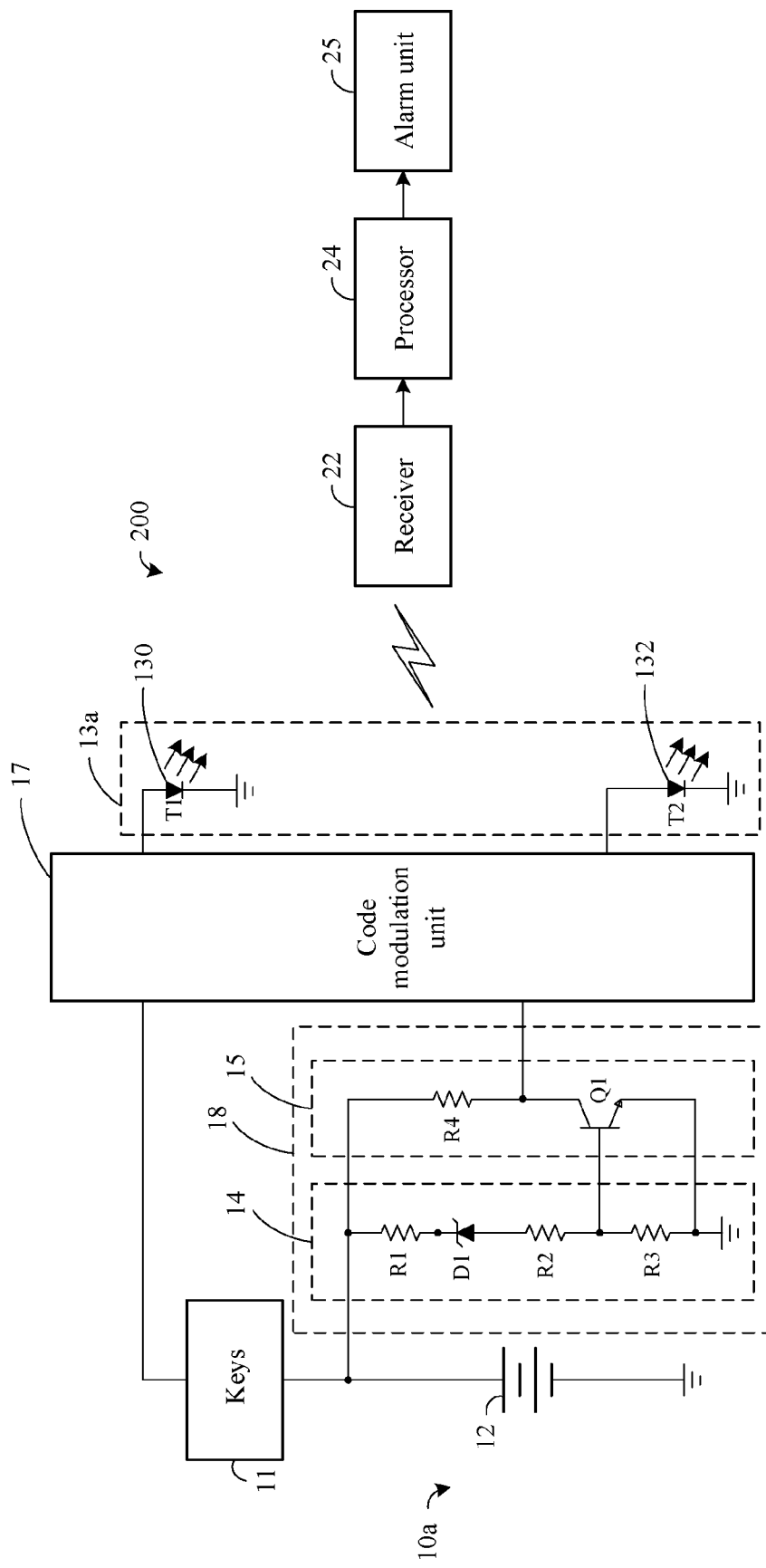
FIG. 5 is a partial circuit of a power indication system in accordance with another exemplary embodiment.

In other embodiments, the transmitter unit 13 of the remote control 10 can include an infrared emitting diode, for specifically serving the switch code signal and generating the switch wireless signal accordingly. For example, referring to FIG. 5, a power indication system 200 in accordance with one embodiment is illustrated. The difference between the power indication system 200 and the power indication system 100 is that the transmitter unit 13a of the power indication system 200 includes a first transmitter 130 and a second transmitter 132.

The first transmitter 130 is configured for generating different key wireless signals according to corresponding different key code signals. In this embodiment, the first transmitter 130 is a first infrared emitting diode T1. The anode of the first infrared emitting diode T1 is electrically connected to the code modulating unit 17 to receive a plurality of different key code signals, and the cathode of the first infrared emitting diode T1 is electrically grounded.

The second transmitter 132 is configured for generating a switch wireless signal according to a switch code signal. In this embodiment, the second transmitter 132 is a second infrared emitting diode T2. The anode of the second infrared emitting diode T2 is electrically connected to the code modulating unit 17 to receive a switch code signal, and the cathode of the second infrared emitting diode T2 is electrically grounded.

The advantage of the power indication system 200 is the same as the power indication system 100 mentioned above.

It is to be understood, however, that even though numerous has been described with reference to particular embodiments, the present disclosure is not limited to the particular embodiments described and exemplified, and the embodiments are capable of considerable variation and modification without departure from the scope of the appended claims.

What is claimed is:

1. A remote control for an electronic device, the remote control comprising:
   a plurality of keys operable to generate different first electrical signals when actuated;
   a power supply operable to power the remote control;
   a power control unit configured for detecting a voltage of the power supply, and generating a second electrical signal when the voltage of the power supply drops below a predetermined value;
   a code modulating unit configured for generating different key code signals according to the different first electrical signals, and further configured for generating a switch code signal according to the second electrical signal; and
   a transmitter unit configured for converting the different key code signals and the switch code signal into different wireless signals, and transmitting the different wireless signals to the electronic device;
   wherein the power control unit comprises:
   a detection circuit configured for detecting the voltage of the power supply, generating a first detection signal when the voltage of the power supply falls below the predetermined value; and
   a switch circuit connected between the power supply and the code modulating unit and configured for establishing an electrical connection between the power supply and the code modulating unit according to the first detection signal, and generating the second electrical signal accordingly.

2. The remote control of claim 1, wherein the detection circuit is further configured for generating a second detection signal when the power supply is no lower than the predetermined value, and the switch circuit is further configured for cutting off the electrical connection between the power supply and the code modulating unit according to the second detection signal.

3. The remote control of claim 1, wherein the transmitter unit is further configured for generating different key wireless signals according to the different key code signals, and transmitting the different key wireless signals to the electronic device.

4. The remote control of claim 3, wherein the transmitter unit is further configured for generating a switch wireless signal according to the switch code signal, and transmitting the switch wireless signal to the electronic device.

5. The remote control of claim 1, wherein the transmitter unit comprises an infrared emitting diode, the anode of the infrared emitting diode is electrically connected to the code modulating unit, and the cathode of the infrared emitting diode is electrically grounded.

6. The remote control of claim 1, wherein the transmitter unit comprises:
   a first transmitter configured for generating different key wireless signals according to the different key code signals, and transmitting the different key wireless signals to the electronic device; and
   a second transmitter configured for generating a switch wireless signal according to the switch code signal, and transmitting the switch wireless signal to the electronic device.

7. The remote control of claim 6, wherein the first transmitter comprises a first infrared emitting diode, the anode of the first infrared emitting diode is electrically connected to the code modulating unit to receive the plurality of different key code signals, the cathode of the infrared emitting diode is electrically grounded, the second transmitter comprises a second infrared emitting diode, the anode of the second infrared emitting diode is electrically connected to the code modulating unit to receive the switch code signal, and the cathode of the second infrared emitting diode is electrically grounded.

8. The remote control of claim 1, wherein the detection circuit comprises:
   a first resistor;
   a second resistor;
   a third resistor; and
   a Zener diode, the cathode of which is electrically connected to the positive terminal of the power supply via the first resistor and the anode of which is electrically grounded successively via the second resistor and the third resistor.

9. The remote control of claim 8, wherein the switch circuit comprises:
   a fourth resistor; and
   a transistor, the collector of which is electrically connected to the positive terminal of the power via the fourth resistor, the base of which is electrically grounded via the third resistor, and the emitter of which is electrically grounded.

10. The remote control of claim 9, wherein the transistor is a NPN type bipolar junction transistor.

11. The remote control of claim 1, wherein the predetermined value is an operating voltage of the remote control.

12. A power indication system, comprising:
    a remote control, comprising:
        a plurality of keys operable to generate different first electrical signals when actuated;
        a power supply operable to power the remote control;
        a power control unit configured for detecting a power state of the power supply, and generating a second electrical signal when the power supply enters a low power state;
        a code modulating unit configured for generating different key code signals according to the different first electrical signals, and further configured for generating a switch code signal according to the second electrical signal; and
        a transmitter configured for converting the different key code signals and the switch code signal into different key wireless signals and a switch wireless signal accordingly; and
    an electronic device configured for receiving the different key wireless signals and the switch wireless signal, and outputting an audio or video alert according to the switch wireless signal;
    wherein the power control unit comprises:
    a detection circuit configured for detecting the voltage of the power supply, generating a first detection signal when the power supply falls below the predetermined value; and
    a switch circuit connected between the power supply and the code modulating unit and configured for establishing an electrical connection between the power supply and the code modulating unit according to the first detection signal, and generating the second electrical signal accordingly.

13. The power indication system of claim 12, wherein the electronic device comprises:
    a receiver configured for receiving the switch wireless signal, and generating a switch driving signal accordingly;
    a processor configured for receiving the switch driving signal, and generating an alert signal accordingly; and
    an alarm unit configured for outputting the audio or video alert according to the alert signal.

14. The power indication system of claim 13, wherein the receiver is further configured for receiving the different key wireless signals, and generating different key driving signals accordingly, the processor is further configured for receiving the different key driving signals, and adjusting the electronic device according to the received key driving signals.

15. The power indication system of claim 12, wherein the electronic device is further configured for adjusting the electronic device according to the received key driving signals.

16. The power indication system of claim 15, wherein the electronic device comprises:
    a receiver configured for receiving the different key wireless signals, and generating different key driving signals accordingly; and
    a processor configured for receiving the different key driving signals, and adjusting the electronic device according to the received key driving signals.

* * * * *